United States Patent
Sivaramakrishnam et al.

(10) Patent No.: US 6,464,782 B1
(45) Date of Patent: Oct. 15, 2002

(54) APPARATUS FOR VAPORIZATION SEQUENCE FOR MULTIPLE LIQUID PRECURSORS USED IN SEMICONDUCTOR THIN FILM APPLICATIONS

(75) Inventors: Visweswaren Sivaramakrishnam, Cupertino, CA (US); Hiroshi Nishizato, Kumamoto (JP); Jun Zhao, Milpitas, CA (US); Ichiro Yokoyama, Sakura (JP)

(73) Assignee: Applied Materials, Inc., Santa Clara, CA (US)

( * ) Notice: Subject to any disclaimer, the term of this patent is extended or adjusted under 35 U.S.C. 154(b) by 791 days.

(21) Appl. No.: 08/652,194

(22) Filed: May 23, 1996

Related U.S. Application Data

(62) Division of application No. 08/274,672, filed on Jul. 13, 1994, now Pat. No. 5,531,183.

(51) Int. Cl.[7] ............................................. C30B 25/16
(52) U.S. Cl. ...................... 117/202; 118/715; 118/719; 118/726
(58) Field of Search ......................... 117/202; 118/715, 118/726, 719

(56) References Cited

U.S. PATENT DOCUMENTS

| | | | |
|---|---|---|---|
| 4,066,481 A | 1/1978 | Manasevit et al. | 148/174 |
| 4,193,835 A | 3/1980 | Inoue et al. | 156/606 |
| 4,529,427 A | 7/1985 | French | 65/3.12 |
| 4,650,539 A | 3/1987 | Irvine et al. | 156/613 |
| 4,845,054 A | 7/1989 | Mitchener | 437/238 |
| 4,950,621 A | 8/1990 | Irvine et al. | 437/81 |
| 5,186,120 A | 2/1993 | Ohnishi et al. | 118/667 |
| 5,262,356 A | 11/1993 | Fujii | 437/225 |
| 5,308,433 A | 5/1994 | Otsuka et al. | 117/93 |

FOREIGN PATENT DOCUMENTS

| | | | |
|---|---|---|---|
| EP | 0 435 088 | 12/1989 | C23C/16/44 |
| GB | 1120650 | 12/1965 | C23C/11/00 |

*Primary Examiner*—Robert Kunemund
(74) *Attorney, Agent, or Firm*—Moser, Patterson & Sheridan

(57) ABSTRACT

A process and apparatus is described for the processing of thin films on semiconductor substrates using one or more liquid precursor sources wherein the liquid precursor source with the highest vapor pressure is first vaporized and then introduced as a vapor into a common manifold connected to a processing chamber, with the point of introduction being spaced away from the processing chamber. A second liquid precursor source, having a vapor pressure lower than the first liquid precursor source, is then introduced in vaporized form into the manifold at a point closer to the processing chamber. This is repeated for each liquid precursor source, with each succeeding liquid precursor source having the next lower vapor pressure being introduced in vaporized form into the manifold at a point closer to the processing chamber than the previous liquid precursor source. A temperature gradient may then be maintained along the manifold with the temperature gradually increased in a direction toward the processing chamber while still mitigating premature boiling of the liquid precursor sources prior to vaporization, or condensation of already vaporized liquid precursor sources or components.

20 Claims, 2 Drawing Sheets

VAPORIZING A HIGH VAPOR PRESSURE LIQUID COMPONENT AND INTRODUCING THE VAPOR INTO A MANIFOLD AT A POINT SPACED APART FROM A PROCESSING CHAMBER WHICH IS CONNECTED TO THE MANIFOLD AT A DOWNSTREAM POINT

VAPORIZING A LOWER VAPOR PRESSURE LIQUID COMPONENT AND INTRODUCING THIS SECOND VAPOR INTO THE MANIFOLD AT A POINT ALSO UPSTREAM OF THE PROCESSING CHAMBER BUT DOWNSTREAM OF THE POINT OF INTRODUCTION OF THE FIRST VAPOR INTO THE MANIFOLD

REPEATING THE SECOND STEP FOR EACH ADDITIONAL LIQUID COMPONENT TO BE INTRODUCED INTO THE MANIFOLD AS A VAPOR, SO THAT THE LIQUID WITH THE LOWEST VAPOR PRESSURE IS INTRODUCED AS A VAPOR INTO THE MANIFOLD AT A POINT CLOSEST TO THE PROCESSING CHAMBER, AND EACH HIGHER VAPOR PRESSURE LIQUID COMPONENT IS INTRODUCED INTO THE MANIFOLD AT A POINT IN ASCENDING ORDER OF VAPOR PRESSURE AWAY FROM THE PROCESSING CHAMBER

OPTIONALLY ESTABLISHING A TEMPERATURE GRADIENT IN THE MANIFOLD WITH THE HIGHEST TEMPERATURE BEING AT THE POINT OF INTRODUCTION, AS A VAPOR, OF THE LOWEST VAPOR PRESSURE LIQUID COMPONENT AND THE LOWEST TEMPERATURE BEING AT THE POINT OF INTRODUCTION, AS A VAPOR, OF THE HIGHEST VAPOR PRESSURE LIQUID COMPONENT

FIG. 1

APPARATUS FOR VAPORIZATION SEQUENCE FOR MULTIPLE LIQUID PRECURSORS USED IN SEMICONDUCTOR THIN FILM APPLICATIONS

CROSS-REFERENCE TO RELATED APPLICATION

This application is a division of U.S. patent application Ser. No. 08/274,672, filed Jul. 13, 1994 now U.S. Pat. No. 5,537,183.

BACKGROUND OF THE INVENTION

1. Field of the Invention

This invention relates to the formation of thin films on semiconductor substrates. More particularly, this invention relates to the vaporization and transport to a deposition chamber of two or more liquid components used in the formation of the thin film on the semiconductor substrate.

2. Description of the Related Art

In the processing of thin films on a semiconductor substrate, for example, as in the formation of a silicon oxide film used in planarization, liquid source precursors or components are often used. These liquids are typically stored in source tanks and are delivered as vapors to a deposition chamber using a delivery system wherein each liquid flows through a separate line and liquid flow meter (to provide individual control of the flow rate of each reactant) and then is injected as a vapor into a common manifold. The vapors flowing in the manifold are then introduced into processing chamber connected to the manifold downstream of the points of entry of the gases and vaporized liquid source precursors into the manifold.

While the vaporous components, upon entering the processing chamber, perform satisfactorily, for example to form a thin film on a semiconductor substrate, it has been found that problems of either condensation of the previously vaporized liquid source component(s) or boiling of the still liquid component(s) in the delivery system can occur, depending upon the temperatures maintained at various points in the delivery system, including along the manifold. For example, if the temperature at a particular point along the manifold is too low (a cold spot), condensation of a previously vaporized liquid precursor source or component may occur at that point in the manifold. On the other hand, maintenance of too high a temperature in the manifold (to prevent such undesirable condensation) can result in boiling/decomposition of a liquid component in the liquid supply line of the particular liquid component upstream of its vaporization and injection into the manifold. This, in turn, can lead to instabilities in the flow rate control of that particular component due to fluctuations of the liquid flow meter as the boiling or near boiling component flows through it.

For example, in the formation of a thin film of silicon oxide on a semiconductor substrate for use as a planarization layer, the silicon oxide is usually doped with phosphorus and/or boron to enhance the flow characteristics of the silicon oxide during a subsequent planarization step. This can result in the use of a liquid silicon source precursor, such as an alkoxysilane, e.g., tetraethylorthosilicate (TEOS), a liquid phosphorus source precursor such as, for example, trimethylphosphite (TMP), triethylphosphite (TEP), or triethylphosphate (TEPO); and/or a liquid boron source precursor such as, for example, trimethylborate (TMB) or triethylborate (TEB).

These liquids are stored in separate source tanks and are delivered as vapors to a deposition chamber using a delivery system wherein the liquid sources of silicon, phosphorus, and boron flow through separate lines and liquid flow meters and then are respectively injected as vapors into a common manifold where they are usually mixed with a carrier gas. The vapors flowing in the manifold are then further mixed with a vapor source of oxygen, usually just prior to entry into a deposition chamber to avoid premature reaction, to form the doped silicon oxide film on the semiconductor substrate in the deposition chamber. Typically the reaction may be either a thermal CVD reaction or a plasma-enhanced CVD reaction. The presence of the dopants in the resulting silicon oxide film lowers the temperature at which the silicon oxide film may be subsequently reflowed to product a planarized film.

While the vaporous components, such as the reactants described above, react in a deposition chamber to form a satisfactory doped silicon oxide film useful for planarization of a structure formed on a semiconductor substrate, it has been found that problems of either condensation or boiling in the delivery system can occur. As described above, if the temperature at a particular point along the manifold is too low, condensation of a previously vaporized reactant may occur at that point in the manifold, while maintenance of too high a temperature in the manifold can result in boiling/decomposition of a liquid precursor in the liquid supply line of that reactant upstream of its vaporization and injection into the manifold, resulting in erratic flow of the liquid precursor through the liquid flow meter.

The resultant instabilities in the flow rate of the reactants, due to either problem, can interfere with the satisfactory formation of a homogeneous product such as a properly doped silicon oxide film. For example, in the above described formation of a phosphorus and/or boron-doped silicon oxide film, premature condensation can affect incorporation of one or more of the dopants into the film, as well as affecting the uniform distribution of the dopant(s) in the silicon oxide film. Additionally, each microlayer of the thin film of silicon oxide could incorporate different concentrations of the respective dopants if the vaporization rates and flow into the processing chamber are not uniform.

It would, therefore, be advantageous if a component delivery system used in the processing of thin films on semiconductor substrates, and in particular a component delivery system which utilizes liquid precursors, could be designed and operated in a manner which would reduce the temperature sensitivity of the respective components in either the vapor or liquid state.

SUMMARY OF THE INVENTION

The invention comprises a process and apparatus for the processing of thin films on semiconductor substrates using liquid precursor sources wherein the liquid precursor source or component with the highest vapor pressure is first vaporized and then introduced as a vapor into a common manifold connected to a processing chamber, with the point of introduction being spaced away from the processing chamber. A second liquid precursor source, having a vapor pressure lower than the first liquid precursor source, is then introduced in vaporized form into the manifold at a point closer to the processing chamber than the entry point of the previous vaporized liquid precursor source. This is repeated for each liquid precursor source, with each succeeding liquid precursor source having the next lower vapor pressure being introduced in vaporized form into the manifold at a point closer to the processing chamber than the previous liquid precursor source. A temperature gradient may then be maintained along the manifold with the temperature gradually increased in a direction toward the processing chamber while still mitigating premature boiling of the liquid precursors prior to vaporization, or condensation of already vaporized components.

BRIEF DESCRIPTION OF THE DRAWINGS

FIG. 1 is a flow sheet illustrating the process of the invention.

DETAILED DESCRIPTION OF THE INVENTION

Figure 2:
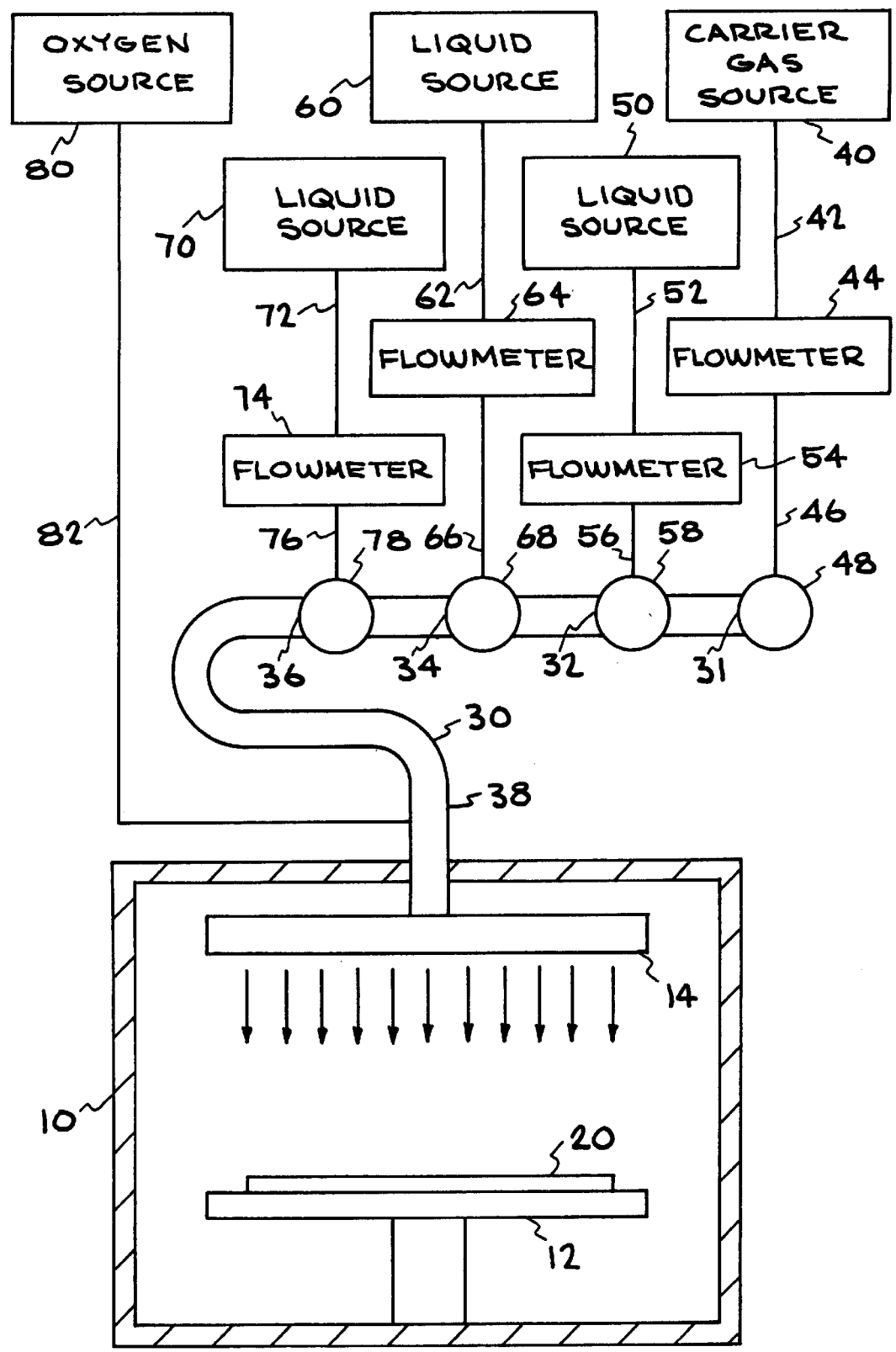
FIG. 2 is a diagrammatic illustration of an arrangement of apparatus embodying the invention.

Referring now to FIG. 1, the process and apparatus of the invention comprise an improvement in the formation of thin films on semiconductor substrates by introduction of the vapors of a plurality of liquid precursor sources into a common manifold upstream of a processing chamber in a particular order of introduction into the manifold. The vapors of the liquid precursor sources are introduced into the manifold in order of their respective vapor pressures, with the liquid precursor source having the highest vapor pressure being introduced into the manifold at a point farthest upstream of the processing chamber. The vapor from the liquid precursor source having the next lower vapor pressure is then introduced at a point downstream of the point of introduction of the vapor from the highest vapor pressure liquid source, i.e., closer to the processing chamber. This is repeated for each liquid precursor source, with the vapor of each succeeding liquid precursor source having the next lower vapor pressure being introduced into the manifold at a point downstream of the point of introduction of the vapor of the preceding liquid precursor source having a higher vapor pressure.

By use of the terms "highest vapor pressure" and "next lower vapor pressure" is meant a comparison of the respective vapor pressures of the various liquids when measured at the same temperature. It will be recognized, of course, that a different temperature may be used for each liquid precursor at its point of entry as a vapor into the common manifold, as will be discussed in more detail below.

Turning now to FIG. 2, by way of illustration and not of limitation, the process and apparatus of the invention will be illustrated with respect to the formation of a film of boron and phosphorus doped silicon oxide glass (BPSG) on a silicon wafer using liquid precursor sources of silicon, phosphorus, and boron.

As illustrated in FIG. 2, a deposition chamber 10 is shown, having a silicon wafer 20 mounted on a susceptor or wafer support 12 in chamber 10. Carrier gas and process gases and/or vapors, from a common manifold 30, enter deposition chamber 10 through a distribution nozzle or showerhead 14 positioned in chamber 10 over wafer 20. Chamber 10 is usually evacuated or maintained at a subatmospheric pressure, but in any event is maintained at a lower pressure than the carrier gas and process gases and/or vapors so that the gases and vapors flow through manifold 30 in the direction of chamber 10, which is usually located at the end of manifold 30.

A source of carrier gas 40, such as argon, nitrogen, or helium, is connected to manifold 30 through a line 42, a flow controller 44, a second line 46, and a shutoff valve 48 through which the carrier gas flows to an entry point 31 which is the farthest away or upstream of deposition chamber 10, so that the carrier gas entering manifold 30 at point 31 passes through the entire length of manifold 30 prior to entering deposition chamber 10.

Downstream of entry point 31 in manifold 30, a liquid source of boron dopant 50, for example, such as triethylborate (TMB), having a vapor pressure of 400 Torr, at 50° C., may be introduced as a vapor into manifold 30 (presuming that this liquid source has the highest vapor pressure—at a given temperature—of all of the liquid sources to be introduced into manifold 30 as a vapor). Liquid boron source 50 is connected through a line 52 to a flowmeter 54 through which the liquid boron dopant source flows to a second line 56 to a combined valve and vaporizer 58 which both vaporizes the liquid boron dopant and controls the amount of boron dopant which flows, as a vapor, into manifold 30 at point 32, which is downstream from carrier gas entry point 31, i.e., closer to processing chamber 10.

Combined valve and vaporizer 58 may comprise a structure wherein the carrier gas traveling along manifold 30 enters through a first port and is carried through a chamber or cavity where the liquid precursor, under pressure, is radially injected into the carrier gas stream from an injection port positioned generally normal to the flow of carrier gas. Flow of the liquid precursor through the injection port opening is controlled by a diaphragm which may, in turn, be controlled by a piezoelectric element electrically connected to a feedback control system to control the flow of liquid precursor through the structure to be vaporized therein. A pressure gradient will, therefore, exist between the liquid aperture port and the remainder of the cavity. The liquid precursor is then vaporized by the resulting pressure differential between the liquid and the vapor and gas in the cavity, and the gas and vapor mixture flows from valve and vaporizer structure 58 back into manifold 30. Vaporizer structure 58 may be provided with heating means (not shown) to maintain the structure above the condensation point of the vapors flowing through the cavity with the carrier gas at reduced pressure, but at a temperature below the boiling or decomposition temperature of the unvaporized liquid precursor maintained at a higher pressure. Such a valve and vaporizer structure is shown in more detail in commonly assigned and copending U.S. patent application Ser. No. 07/990,755, filed Dec. 12, 1993, the disclosure of which is hereby incorporated herein by reference.

A liquid source of phosphorus dopant 60, such as, for example, trimethylphosphite (TMP), having a vapor pressure of 70 Torr at 50° C., is then connected through a line 62 to a flowmeter 64. The liquid phosphorus dopant source flows through flowmeter 64 to a second line 66 to a combined valve and vaporizer 68, similar or identical to valve and vaporizer 58 described above, which both vaporizes the liquid phosphorus dopant and controls the amount of phosphorus dopant which flows as a vapor into manifold 30 at point 34, which is downstream from both carrier gas entry point 31 and entry point 32 of the boron dopant vapor.

As in the previously described structure, the temperature of valve and vaporizer 68 may be maintained within a range sufficient to result in vaporization of the liquid phosphorus source without, however, causing the unvaporized liquid precursor to either boil or decompose. Since the particular liquid boron dopant source, in the combination of liquid precursor sources being described, has a higher vapor pressure than the particular liquid phosphorus dopant source, maintaining the temperature of valve and vaporizer 68, and manifold 30 at point of entry 34 of the vapors of the phosphorus dopant, sufficiently high to permit vaporization of the liquid phosphorus source will not result in condensation of the already vaporized boron dopant source at that point in manifold 30.

While it may not be necessary to heat manifold 30 between entrance point 32 of the vapors of the liquid boron precursor and entrance point 34 of the vapor of the liquid phosphorus precursor, it may be preferable to maintain the temperature of manifold 30, between points 32 and 34 at a temperature intermediate to the respective temperatures maintained in valve and vaporizers 58 and 68. This, for example, may be achieved by wrapping manifold 30 with heating tape, between points 32 and 34, and connecting the heating tape to an adjustable external power source.

It will be noted that the vapor pressure of the above trimethylphosphite liquid phosphorus dopant source is lower than the vapor pressure of the trimethylborate liquid boron dopant source (at the same temperature). Hence, in accordance with the invention, the vapor of the vaporized liquid phosphorus dopant source is introduced into manifold 30 downstream of the vapor of the vaporized liquid boron dopant source. However, if a different liquid phosphorus dopant source was used which, at the same temperature, had a higher vapor pressure than the liquid boron dopant source, then the vaporized liquid phosphorus dopant source would be introduced first into manifold 30, i.e. introduced into manifold 30 at a point spaced the farthest upstream from deposition chamber 10. For example, if triethylborate and trimethylphosphite were used as the respective sources of boron and phosphorus, then the trimethylphosphite vapor would be introduced into manifold 30 at a point upstream of the introduction of the triethylborate vapor, since trimethylphosphite has a higher vapor pressure (at the same temperature) than triethylborate.

It should be emphasized that the comparison of the respective vapor pressures of the liquid precursors is made at a common reference temperature for comparison purposes only, to determine the order of entrance of the respective vapors into manifold 30. The actual pressures at which the individual liquid precursors are respectively vaporized and introduced into the flowing stream of gas and vapor in manifold 30 will be dependent upon other external factors, including the temperature of the individual vaporizer and the pressure in manifold 30.

Still referring to FIG. 2, a liquid source of silicon 70, for example an alkoxy silane such as tetraethylorthosilicate (TEOS), having a vapor pressure of 9 Torr, at 50° C., is connected to manifold 30 through a line 72 to a flowmeter 74 through which the liquid silicon source flows to a second line 76 and thence to a combined valve and vaporizer 78 (also identical or similar to valve and vaporizer structure 58) which both vaporizes the liquid silicon source and controls the amount of the silicon source which flows as a vapor into manifold 30 at point 36. Point 36 is shown in FIG. 2, as being downstream from carrier gas entry point 31, boron dopant vapor entry point 32, and phosphorus dopant vapor entry point 34, because of the lower vapor pressure of TEOS, compared to that of trimethylborate and trimethylphosphite. If, however, liquid precursor sources of either boron and/or phosphorus having vapor pressures less than that of TEOS are used, then the point of entry of the vaporized TEOS into manifold 30 would be changed accordingly.

Furthermore, if other liquid silicon sources such as other alkoxysilanes, e.g., trimethoxysilane, tetramethoxysilane, or triethoxysilane, are used instead of TEOS, then, in accordance with the invention, the point of entry of the vaporized silicon source into manifold 30 would be suitably adjusted, if necessary, relative to the entry points of other vaporized liquid precursor sources, based on the vapor pressure of the particular liquid source of silicon, with respect to the vapor pressures of the other liquid precursors at the same temperature.

A gaseous source of oxygen 80, which may comprise $O_2$, $O_3$, or a mixture thereof, may then be introduced into manifold 30 by flowing the oxygen source through a line 82 to a point of entry 38 downstream of entry points 34, 36, and 36, of the vapors of the respective liquid sources of dopants and silicon. As mentioned earlier, such an oxygen source should preferably have a point of entry into manifold 30 just prior to the entry of the gases and vapors into the deposition chamber, to avoid premature reaction of the oxygen, in the manifold, with the other gases and vapors in manifold 30.

Finally, after introduction of all of the reactants into manifold 30, and with the vapors of the respective liquid precursors injected into manifold 30 in descending order of vapor pressure as the respective points of entry approach deposition chamber 10, in accordance with the invention, the gaseous mixture enters deposition chamber 10 through distribution nozzle or showerhead 14 over wafer 20. The result is a controllable flow of the vapor/gas mixture through manifold 30 from the respective gaseous and liquid sources of the reactants while eliminating or mitigating condensation of any of the already vaporized components in the manifold or premature boiling or decomposition of any of the unvaporized liquid reactant sources in the flow meters or liquid lines adjacent the flow meters.

The following description of the formation of BPSG layers on a number of silicon wafers, using TEOS, trimethylphosphite, and trimethylborate will serve to further illustrate the practice of the invention. Into one end of a manifold, connected at its opposite end to a deposition chamber, was flowed 1000 sccm of helium gas at a temperature of about 100° C. The temperature at the point of entry of the helium gas, was maintained at about 100° C. by a closed loop temperature control system. Liquid trimethylborate, from a liquid trimethylborate source, was flowed through a flowmeter at a rate of 50 milligrams/minute and then vaporized and injected into the manifold at a point downstream of the helium entry point. The manifold at the point of entry of the boron-containing dopant vapors was maintained at about 80° C. Liquid trimethylphosphite, from a liquid trimethylphosphite source, was flowed through a second flowmeter at a rate of 20 milligrams/minute and then vaporized and injected into the manifold at a point downstream of the boron-containing vapor entry point. The manifold at the point of entry of the phosphorus-containing dopant vapors was maintained at about 120° C. Liquid TEOS was also flowed through a flowmeter at a rate of 500 milligrams/minute and then vaporized and injected into the manifold at a point downstream of the phosphorus-containing vapor entry point. The manifold at the point of entry of the TEOS vapors was maintained at about 120° C. Finally, at a point closest to the connection of the manifold to the deposition chamber, a mixture of $O_2$ and 8 wt. % $O_3$ was flowed into the manifold at a rate of about 4000 sccm. The manifold, from the point of entry of the TEOS vapors to the processing chamber, was maintained at a temperature of about 100° C. The process was repeated for a number of wafers using the same standard flow control and temperatures for each wafer.

The resulting BPSG coatings or films formed on the silicon wafers were each examined for the formation of a homogeneously doped silicon oxide glass layer, using Fourier Transform Infra-Red Reflectance Spectroscopy (FTIR Spectroscopy). Uniform coatings, with a variation in boron or phosphorus content of less than 0.1% from BPSG film to BPSG film from wafer to wafer, were found to have resulted from the practice of the invention. This indicated that the problems of condensation of previously vaporized reactants, and/or premature boiling of unvaporized reactants had been either been eliminated or sufficiently mitigated to permit repeatable formation of uniformly doped BPSG films or layers on silicon wafers.

Thus, the invention provides a process and apparatus for forming a coating film on a semiconductor substrate, using two or more liquid precursor sources, wherein liquid precursor sources are respectively vaporized and introduced into a common manifold in order of descending vapor pressure (when measured at the same temperature), with the liquid precursor source having the highest vapor pressure being introduced into the manifold at a point spaced the farthest distance from the process chamber into which the mixture of gases and vapors flow from the manifold. The process and apparatus of the invention eliminates or mitigates condensation in the manifold of previously vaporized liquid precursor sources and/or boiling or decomposition of liquid precursor sources prior to vaporization, whereby a more uniform distribution of process gases and vapors is delivered to the processing chamber, resulting in the formation of a film of enhanced homogeneity.

Having thus described the invention what is claimed is:

1. Apparatus for the processing of thin films on semiconductor substrates using two or more liquid precursor sources wherein, at a common temperature, a first of said two or more liquid precursor sources has a higher vapor pressure than a second of said two or more liquid precursor sources, which comprises:
   (a) a processing chamber;
   (b) a manifold connected to said processing chamber;
   (c) apparatus for vaporizing said first of said liquid precursor sources, having said higher vapor pressure, including apparatus for introducing the resulting vapor into said manifold at a first point spaced away from said processing chamber; and
   (d) apparatus for vaporizing said second of said liquid precursor sources, having a vapor pressure lower than said first of said liquid precursor sources, including apparatus for introducing the resulting vapor into said manifold at a second point spaced closer to said processing chamber than said first point of introduction of said vaporized first liquid precursor source;
   whereby, each subsequent downstream liquid precursor source has a lower vapor pressure than all preceding liquid precursor sources.

2. The apparatus of claim 1 which further includes apparatus for maintaining a temperature gradient along said manifold with the temperature gradually increased in a direction toward said processing chamber.

3. Apparatus for the processing of thin films on semiconductor substrates using two or more liquid precursor sources wherein, at a common temperature, a first of said two or more liquid precursor sources has a higher vapor pressure than a second of said two or more liquid precursor sources, which comprises:
   (a) a processing chamber;
   (b) a manifold connected to said processing chamber;
   (c) apparatus for vaporizing said first of said liquid precursor sources, having said higher vapor pressure, including apparatus for introducing the resulting vapor into said manifold at a first point spaced away from said processing chamber;
   (d) apparatus for vaporizing said second of said liquid precursor sources, having a vapor pressure lower than said first of said liquid precursor sources, including apparatus for introducing the resulting vapor into said manifold at a second point spaced closer to said processing chamber than said first point of introduction of said vaporized first liquid precursor source; and
   (e) apparatus for vaporizing a third liquid precursor source, having a vapor pressure lower than said first or second of said liquid precursor sources, including apparatus for introducing the resulting vapor into said manifold at a third point spaced closer to said processing chamber than said first and second points of introduction of said respectively vaporized first and second liquid precursor sources;
   whereby premature boiling of said liquid precursor sources prior to vaporization, or condensation of already vaporized liquid precursor sources will be mitigated because each subsequent downstream liquid precursor source has a lower vapor pressure than all preceding liquid precursor sources.

4. The apparatus of claim 3 which further includes apparatus for maintaining a temperature gradient along said manifold with the temperature gradually increased in a direction toward said processing chamber.

5. The apparatus of claim 1, wherein one of the two or more liquid precursor sources comprises a source of boron dopant.

6. The apparatus of claim 1, wherein one of the two or more liquid precursor sources comprises a source of phosphorous dopant.

7. The apparatus of claim 1, wherein one of the two or more liquid precursor sources comprises a source of silicon.

8. The apparatus of claim 1, wherein the processing chamber is a chemical vapor deposition chamber.

9. The apparatus of claim 3, wherein one of the two or more liquid precursor sources comprises a source of a boron dopant.

10. The apparatus of claim 3, wherein one of the two or more liquid precursor sources comprises a source of a phosphorous dopant.

11. The apparatus of claim 3, wherein one of the two or more liquid precursor sources comprises a source of silicon.

12. The apparatus of claim 3, wherein the processing chamber is a chemical vapor deposition chamber.

13. An apparatus for depositing thin films on substrates using a plurality of liquid precursors comprising a first liquid precursor having a first vapor pressure at a first temperature and a second liquid precursor having a second vapor pressure at the first temperature wherein the second vapor pressure is lower than the first vapor pressure, the apparatus comprising:
   a) a manifold in communication with the plurality of liquid precursors;
   b) a process chamber in communication with a first end of the manifold;
   c) a first liquid precursor coupled to the manifold at a first inlet; and
   d) a second liquid precursor coupled to the manifold at a second inlet, wherein the second inlet is disposed closer to the first end of the manifold than the first inlet; and
   e) a first vaporizer disposed between the first inlet and the first liquid precursor and a second vaporizer disposed between the second inlet and the second liquid precursor;

whereby, each subsequent downstream liquid precursor has a lower vapor pressure at the first temperature than all preceding upstream liquid precursors.

14. The apparatus of claim 13, further comprising a carrier gas coupled to a second end of the manifold upstream from the first and second inlets.

15. The apparatus of claim 13, further comprising a heating member communicating with the manifold to support a temperature gradient increasing from a second end of the manifold to the first end.

16. The apparatus of claim 13, wherein one of the plurality of liquid precursor sources comprises a source of a boron dopant.

17. The apparatus of claim 13, wherein one of the plurality of liquid precursor sources comprises a source of a phosphorous dopant.

18. The apparatus of claim 13, wherein one of the plurality of liquid precursor sources comprises a source of silicon.

19. The apparatus of claim 13, wherein the first vaporizer is maintained at a lower temperature than the second vaporizer.

20. An apparatus for depositing a thin film on a substrate in a chamber, comprising two or more liquid precursor sources sequentially coupled to a manifold, wherein each liquid precursor contained in each of the liquid precursor sources has a lower vapor pressure at a first temperature than all upstream liquid precursors.

* * * * *

UNITED STATES PATENT AND TRADEMARK OFFICE
CERTIFICATE OF CORRECTION

PATENT NO. : 6,464,782 B1
DATED : October 15, 2002
INVENTOR(S) : Visweswaren Sivaramakrishnan et al.

It is certified that error appears in the above-identified patent and that said Letters Patent is hereby corrected as shown below:

Title page, Item [54] and Column 1, line 1,
Please delete "APPARATUS FOR".

Title page,
Item [12], please change "Sivaramakrishnam" to -- Sivaramakrishnan --.
Item [75], Inventors, please change "Sivaramakrishnam" to -- Sivaramakrishnan --.

Column 1,
Line 10, please change "5,537,183" to -- 5,531,183 --.

Column 2,
Line 15, please change "product" to -- produce --.

Column 4,
Line 7, please change "such as trineth-" to -- such as trimeth- --.

Column 6,
Lines 12-13, please change "34, 36, and 36," to -- 32, 34, and 36, --.

Signed and Sealed this

Twenty-fifth Day of March, 2003

JAMES E. ROGAN
*Director of the United States Patent and Trademark Office*